United States Patent
Calcott

(10) Patent No.: US 7,280,576 B2
(45) Date of Patent: Oct. 9, 2007

(54) TYPE II MID-INFRARED QUANTUM WELL LASER

(75) Inventor: Philip Douglas John Calcott, Malvern (GB)

(73) Assignee: Qinetiq Limited (GB)

(*) Notice: Subject to any disclaimer, the term of this patent is extended or adjusted under 35 U.S.C. 154(b) by 122 days.

(21) Appl. No.: 10/489,238

(22) PCT Filed: Sep. 10, 2002
(Under 37 CFR 1.47)

(86) PCT No.: PCT/GB02/04111

§ 371 (c)(1),
(2), (4) Date: Jan. 24, 2005

(87) PCT Pub. No.: WO03/023912

PCT Pub. Date: Mar. 20, 2003

(65) Prior Publication Data
US 2006/0025835 A1    Feb. 2, 2006

(30) Foreign Application Priority Data
Sep. 11, 2001 (GB) .................................. 01219039

(51) Int. Cl.
*H01S 5/00* (2006.01)
(52) U.S. Cl. .............................. 372/45.011; 372/45.012
(58) Field of Classification Search ........... 372/45.011, 372/45.012
See application file for complete search history.

(56) References Cited

U.S. PATENT DOCUMENTS 5,189,679 A * 2/1993 Derry et al. ............ 372/45.011
5,251,225 A * 10/1993 Eglash et al. ............ 372/45.01
5,793,787 A * 8/1998 Meyer et al. ............ 372/45.01

FOREIGN PATENT DOCUMENTS

WO    WO 01/26192    4/2001

OTHER PUBLICATIONS

Grein et al, "Theoretical Performance of InAs/InxGa1-SB superlattice-based midwave infrared lasers", Journal of Applied Physics, pp. 1940-1942 (1994).
Chow et al, "Mide-wave infrared diode lasers based on GainSB/InAs and InAs/AlSb superlattices", Appl. Phys. Letter, pp. 3700-3702 (1995).
Hansberger et al., "Demonstration of 3.5 um Ga1-xInxSb/InAs superlattice diode laser", Electronics Letters, pp. 275-276 (1995).

* cited by examiner

Primary Examiner—Armando Rodriguez
(74) Attorney, Agent, or Firm—McDonnell Boehnen Hulbert & Berghoff LLP

(57) ABSTRACT

A mid-infrared emitting indirect bandgap quantum well semiconductor laser with an optical waveguide structure having an active waveguide core. The active waveguide core comprises at least one repetition of a sub-region comprising in the following order a first wide bandgap layer, a first conduction band layer of InAs, a valence band layer of $Ga_{(1-x)}In_xSb$ where $x \geq 0.7$, preferably of InSB (ie. $x=1$), having a thickness of less than 15 Angstroms, a second conduction band layer of InAs and a second wide bandgap barrier layer. The barrier layers co-operate to provide electrical confinement for the carriers within the intervening conduction band and valence band layers and optical confinement in the active core region is provided by the optical waveguide structure.

12 Claims, 3 Drawing Sheets

TYPE II MID-INFRARED QUANTUM WELL LASER

The present invention relates to semiconductor lasers and particularly to semiconductor lasers for mid-infrared (mid-IR) wavelengths, typically of the order of 4 μm to 12 μm.

There is a growing demand for efficient mid-IR lasers operating either at ambient temperatures or at temperatures accessible with a thermoelectric cooler (>180K). Applications for such lasers include optical gas sensing systems for pollution, leak detection etc and laser surgery.

It has proved difficult to develop high power semiconductor lasers emitting at infrared wavelengths above around 2.5 μm without using cryogenic cooling techniques. The mechanisms limiting the performance of previous diode lasers operating at mid-IR wavelengths are inadequate electrical confinement due to small conduction band and/or valence band offsets, the increasing predominance of Auger recombination when the energy gap is lowered and the temperature is raised and intersubband absorption. Auger recombination is usually dominated by processes involving exciting holes to higher states in the valence band and limits the performance of lasers at higher temperatures. Intersubband absorption is usually dominated by intervalence band absorption which is again a process involving exciting holes to higher states in the valence band and limits laser efficiency.

The achievement of high gain in such semiconductor lasers requires strong optical coupling between the conduction and valence band states. Thus, most known quantum well lasers previously developed have employed Type I or direct valence and conduction band alignment, ie. where the conduction band minimum and the valence band maximum are in the same growth layer. However, mid-IR quantum well lasers with acceptable gain have been reported by the use of Type II or indirect valence and conduction band alignment, ie. where the conduction band minimum and the valence band maximum are in different growth layers. The Type II lasers can be designed so that even though the maxima of the electron and hole waveforms are offset, there is sufficient overlap for good optical coupling.

A type II quantum well laser having reduced probability of Auger recombination and having separate optical confinement and improved electrical confinement is discussed in U.S. Pat. No. 5,793,787 by Meyer et al. U.S. Pat. No. 5,793,787 describes a laser having an active region including at least one repeated sub-region wherein each sub-region comprises a first barrier region for providing electrical confinement, a first conduction band region including the conduction band minimum, a valence band region including the valence band maximum and a second conduction band region including the conduction band minimum. The last repeat of the sub-region is completed by a further barrier region. The active region is surrounded by optical cladding layers which provide separate optical confinement. The composition and thickness of the layers forming the active region are configured in order to reduce Auger recombination and to this end requires the valence band region to be made from such materials as $Ga_{1-x}In_xSb$ where $x \leq 0.6$, GaSb, GaInSbAs or GaInAlSb with a thickness of between 15 and 70 Angstroms. In the example disclosed in U.S. Pat. No. 5,793,787 the valence band of the active region is a 31 Angstrom thick layer of $Ga_{0.7}In_{0.3}Sb$.

It is desirable to further improve the efficiency of Type II quantum well semiconductor lasers by improving the confinement of carriers and by further suppression of the loss mechanism of Auger recombination and intersubband absorption.

According to the present invention there is provided a mid-infrared emitting Type II quantum well semiconductor laser having an optical waveguide structure with an active waveguide core which core comprises at least one repetition of a sub-region comprising in the following order:
- a first wide bandgap barrier layer;
- a first conduction band layer of InAs;
- a thin valence band layer of $Ga_{(1-x)}In_xSb$ where $x \geq 0.7$;
- a second conduction band layer of InAs; and
- a second wide bandgap barrier layer which co-operates with the first barrier layer to provide electrical confinement for the carriers within the intervening conduction band and valence band layers.

Each active sub-region of the laser according to the present invention uses a spatially indirect multi-quantum well structure which consists of very thin GaInSb valence band layer with a much higher Indium content than the $Ga_{(1-x)}In_xSb$ typically used in which $0 \leq x \leq 0.3$. The present structure results in favourable band alignments with very deep hole and electron wells. The present structure also creates great strain in the GaInSb layer because of the large lattice mismatch with the substrate when grown on a GaSb or InAs substrate. This strain is managed in the present design by keeping the valence band layer thin. If the valence band later is grown too thick it will relax, or assume a 3-D growth mode, which will adversely effect the performance of the laser. The optical confinement is maximised if the quantum wells are concentrated at the peak of the optical mode in the optical waveguiding region.

The thickness of the InAs conduction band layers is chosen to ensure that the electron subband energy levels are at the required energy to give the required bandgap (ie. the required energy separation between the first confined electron subband and the first confined hole subband). To achieve this the InAs conduction band layers are preferably less than 15 monolayers thick which corresponds to a thickness of less than 50 Angstoms thick. More preferably, they are less than 8 monolayers thick.

The thickness of the thin valence band layer is preferably of the order of three monolayers or less than 15 Angstroms.

The laser may be optically pumped, for example by use of standard 980 nm high power lasers or by shorter wavelength GaAs based laser diodes. The use of optical pumping has the advantage that no diode structure is required and hence the design of the laser does not have to take account of doping problems in the active core region or the waveguiding region. Free carrier absorption is a significant loss mechanism at mid-IR wavelengths and so eliminating doping reduces absorption losses in the tails of the optical mode.

Alternatively, the laser may be electrically pumped. Electrical pumping can be achieved by the cascading of the laser structure according to the present invention. This entails separating repeats of the active sub-region by a tunnelling region that forces electrons from the valence band into the conduction band. This effectively re-uses the electrons (or current) many times as they pass through the laser structure and so more light is generated. The type of cascade arrangement described in a paper by Yang et al entitled "Mid-infrared interband cascade lasers with quantum efficiencies >200%" published in Applied Physics Letters, Vol. 72, no. 18, 4 May 1998, a paper by Bradshaw et al entitled "High efficiency interband lasers with peak power exceeding 4W/facet" published in Applied Physics Letters, Vol. 75, No. 16, 18 Oct. 1999 and a paper by Bruno et al entitled "Low threshold interband cascade lasers with power efficiency exceeding 9%" published in Applied Physics Letters, Vol. 76, No. 22, 29 May 2000, could be applied to the structure according to the present invention. A cascaded laser arrangement using the structure according to the present invention should operate efficiently at room temperature. The penalty of using a cascaded structure is that higher operating voltages are required, but this is much preferably to higher currents. The electrical pumping would be provided by a conventional diode structure of the type described in U.S. Pat. No. 5,793,787.

The waveguide structure used in the laser may comprise optical cladding layers of AlAsSb.

In a preferred embodiment of the present invention the sub-region is repeated less than 10 times and preferably between 1 and 5 times. Having many repeats of even very thin highly strained regions can result in the structure relaxing. Accordingly, it is important that the design of laser uses separate optical and electrical confinement, ie. optical confinement provided by the waveguide structure of the laser and electrical confinement provided by the barrier layers in each sub-region. This allows the laser structure to have just a few repeats of the sub-region in the active region in the core of an optical confinement region.

The barrier layers are preferably made of AlGaAsSb or alternatively of AlGaInAsSb. In a preferred embodiment the valence band layer comprises $Ga_{(1-x)}In_xSb$ where x>0.9 and in a further preferred embodiment the valence band layer comprises InSb. Preferably, the laser is grown on a substrate of GaSb or InAs.

According to a second aspect of the present invention there is provided a cascaded laser diode having a structure as described above.

According to a third aspect of the present invention there is provided a method of operating a laser with a structure as described above by optical pumping.

According to a fourth aspect of the present invention there is provided a method of operating a cascaded laser diode according to the second aspect of the present invention by electrical pumping.

The present invention will now be described by way of example only with reference to the accompanying figures in which.

Figure 1:
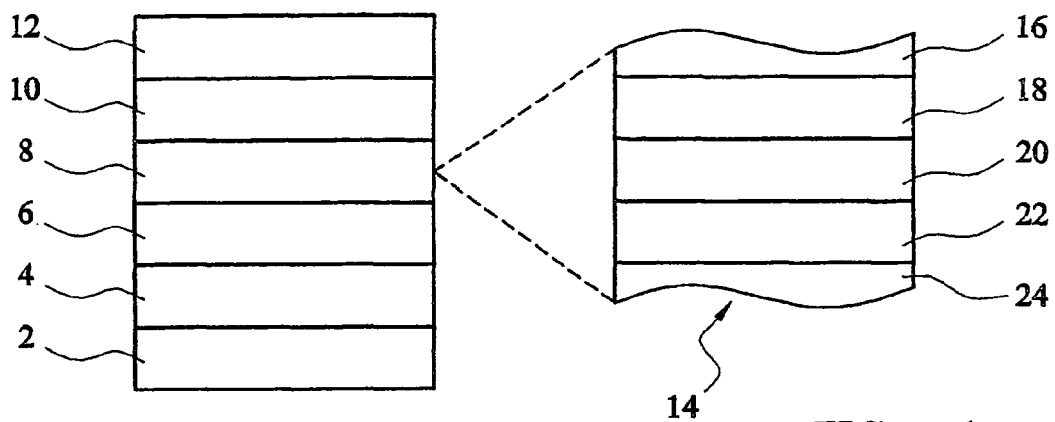
FIG. 1 depicts a schematic cross section of a MID-IR Type II quantum well laser according to the present invention.

The laser (2) shown in FIG. 1 is grown on a substrate layer (2) of InAs and comprises a 1 μm thick buffer layer of InAs (4), a first 1 μm thick optical cladding layer of lattice matched AlAsSb (6), an active region (8) which is approximately 1 μm thick, a second 1 μm thick optical cladding layer of AlAsSb (10) and a capping layer (12) of InAs. The InAs buffer layer (4) is optional. The buffer layer (4) and capping layer (12) should be the same material as the substrate (2) and as an alternative to InAs could be made of GaSb. The refractive index of the optical cladding layers (6) and (10) is lower than the average weighted refractive index of the active layer (8) in order to provide optical confinement to the active region (14). The refractive index of the cladding layers (6) and (10) is in the range of 2.8 to 3.35 and must be at least 0.1 lower than the average weighted refractive index of the active layer (8) in order to provide adequate optical confinement.

The active layer (8) of the laser shown in FIG. 1 comprises a plurality of repeated sub-regions (14). Each sub-region (14) comprises a first barrier layer (16), a first conduction band layer (18), a valence band layer (20), a second conduction band layer (22) and a second barrier layer (24). The first barrier layer (16) of each sub-region (14) is a continuation of the second barrier layer (24) of the previous sub-region (14), except for the two end barrier layers of the active layer (8). Typically, the sub-region (14) will be repeated between 1 and 5 times.

Figure 2:
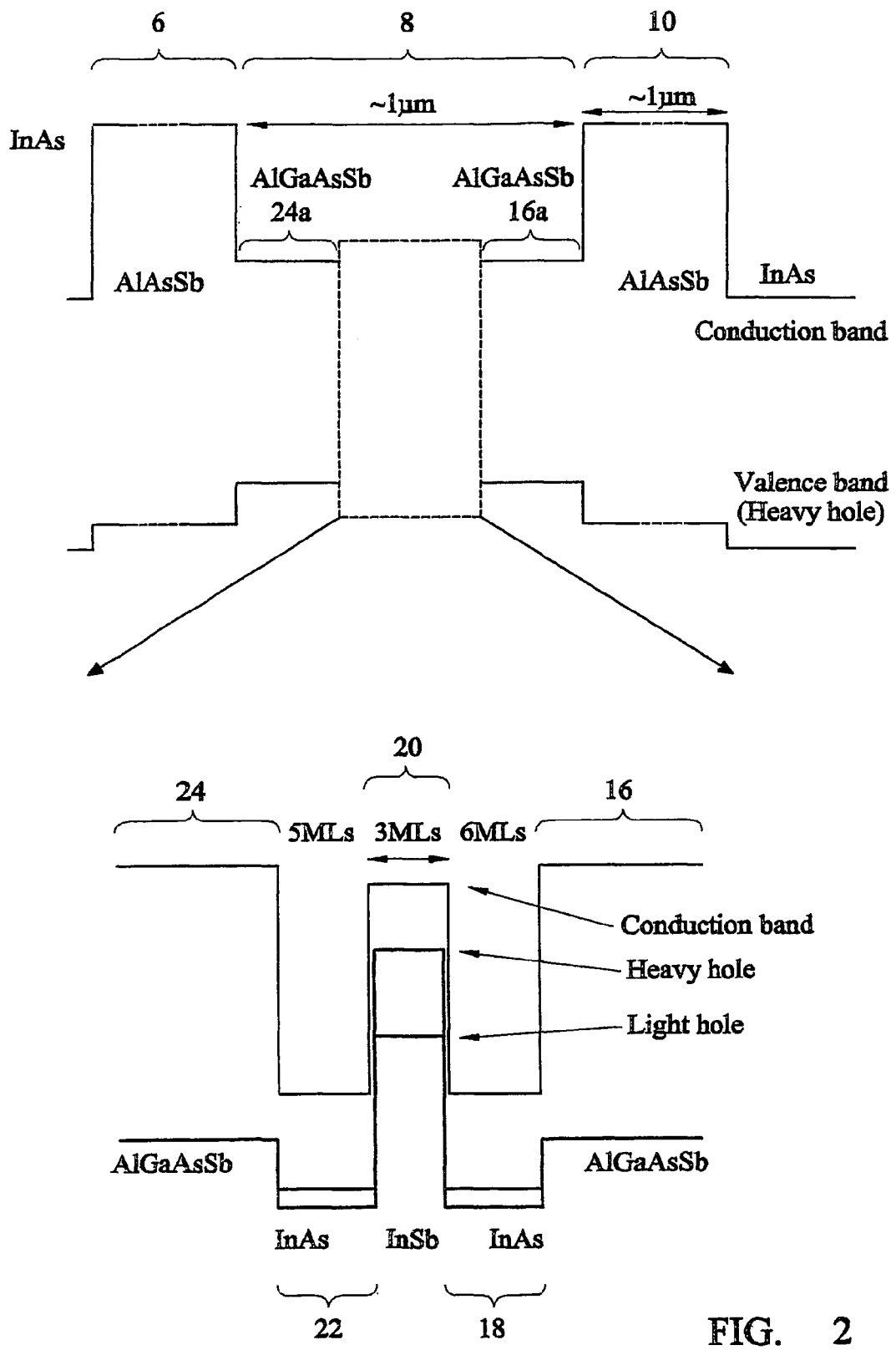
FIG. 2 depicts schematically the conduction and valence band profile of the laser depicted in FIG. 1 and depicts the bulk-like band edges in the absence of the quantum confinement effects present in the laser according to the present invention.

FIG. 2 shows the conduction band and valence band profile associated with the laser of FIG. 1. It shows the band profiles for cladding layers (6) and (10) and for the two end barrier layers (16a, 24a) of the active layer (8) as well as for one repeated sub-region (14) of the active layer (8). The quantum confined subband levels are not included in FIG. 2 as only the bulk-like band edges are shown.

Referring now to FIGS. 1 and 2, the barrier layers (16, 24) are made of $Al_{0.6}Ga_{0.4}As_{0.14}Sb_{0.86}$. The core region between the layers (16a) and (24a) will typically have a thickness of between 0.5 μm and 3 μm and will consist almost entirely of barrier material as the other layers in the core are so thin. The barrier layers (16, 24) provide electrical confinement for the electrons and to some extent the holes in the conduction band layers (18, 22) and valence band layer (20). Alternatively, the barrier layers could comprise a digital superlattice or a thin wide gap region next to the adjacent conduction band layer and a narrow gap region for the rest of the barrier layer.

The first and second conduction band layers (18, 22) of each sub-region (14) are each made of a layer in InAs. The valence band layer (20) of each sub-region (14) is made of a layer of InSb, ie. a layer of GaInSb comprising 100% Indium, which is of the order of three molecular layers thick (9 to 10 Angstroms thick). Alternatively the valence band could be made from $Ga_{1-x}In_xSb$ where x>0.7.

The laser described above in relation to Figures. 1 and 2 is designed to be optically pumped which has the advantage that no diode structure is required which means that problems in the active region (14) associated with doping do not arise. Free carrier absorption is a significant loss mechanism in mid-IR lasers and so eliminating doping reduces absorption losses in the tails of the optical mode. The lack of doping in the waveguide cladding layers (6) and (10) is also advantageous.

Figure 3:
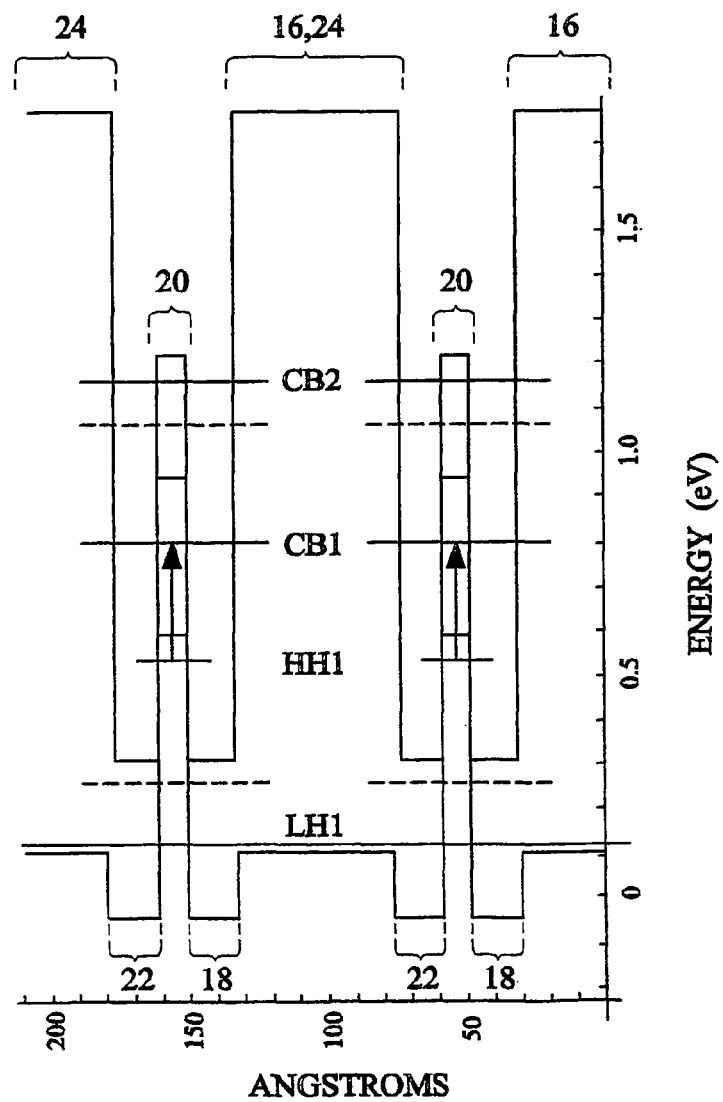
FIG. 3 is a more detailed representation of the conduction and valence band profile shown in FIG. 2 for a laser designed to operate at 4.71 μm with the various energy subbands shown.

A more detailed representation of the band structure of the active region of the laser of FIGS. 1 and 2, designed for operation at around 4.7 μm is shown in FIG. 3. FIG. 3 shows two repetitions of the sub-region (14), however, in practice the central barrier layer (16,24) would be much thicker (of the order of 100 Angstroms) than shown as compared to the conduction band and valence band layers. In FIG. 3 the first conduction band layer (18) of InAs is of the order of 6 molecular layers thick and the second conduction band layer (22) of InAs is of the order of 5 molecular layers thick. The lowest lying conduction band state CB1 has an energy level of 0.8028 eV and the highest lying valence band state HH1 has an energy level of 0.5399 eV, giving a bandgap of 0.2628 eV which corresponds to a wavlength of 4.74 μm.

The design of the sub-region with a very thin layer of GaInSb with an Indium concentration of 100% causes separation of the valence sub-bands HH1 (0.5399 eV) which contains the initial states for hole excitation processes and and LH1 (0.1198 eV) which contains the final states. This separation of 0.4201 eV is significantly larger than the band gap of 0.2628 eV at zone centre. The first heavy hole subband HH1 is highest in energy and the strain and confinement upshift ensures that the first light hole subband LH1 is more than a band gap lower in energy than the first heavy hole subband. The dotted line below level HH1 shows an energy level one bandgap lower than level HH1. There are two electron sub-bands in the conduction band region CB1 at 0.8028 eV and CB2 at 1.1670 eV. Again, the second subband CB2 is more than one band gap in energy above the first. The dotted line above CB1 shows an energy level one bandgap higher than CB1. Thus, certain types of hole and electron excitation processes are rendered much less likely due to a decrease of the available final states for these processes. In particular intervalenceband absorption is virtually eliminated and Auger recombination rates much reduced.

The overall effect of the electron and hole excitation suppression combined with good optical and electrical confinement enables high power, low threshold operation at elevated temperatures.

Figure 4:
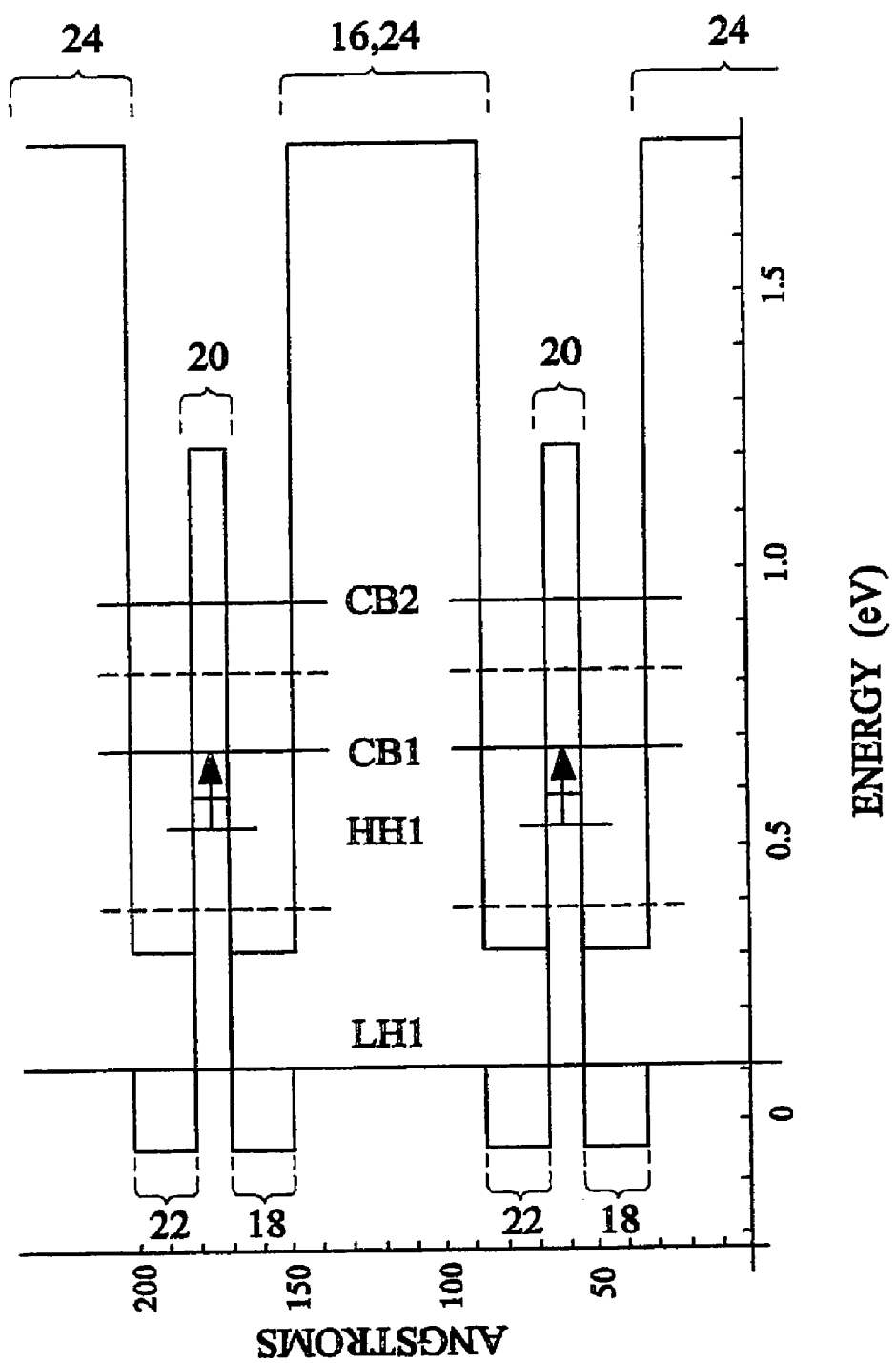
FIG. 4 is a more detailed representation of the conduction and valence band profile shown in FIG. 2 for a laser designed to operate at 8.991 μm with the various energy subbands shown.

A more detailed representation of the band structure of the active region of the laser of FIGS. 1 and 2, designed for operation at around 8.99 μm is shown in FIG. 4. Similarly to FIG. 3, FIG. 4 shows two repetitions of the sub-region (14), however, in practice the central barrier layer (16,24) would be much thicker (of the order of 100 Angstroms or greater) than shown as compared to the conduction band and valence band layers. In FIG. 4 the first and second conduction band layers (18) and (22) of InAs are each of the order of 8 molecular layers thick. The lowest lying conduction band state CB1 has an energy level of 0.6779 eV and the highest lying valence band state HH1 has an energy level of 0.5399 eV, giving a bandgap of 0.138 eV which corresponds to a wavlength of 8.99 μm.

Again, the design of the sub-region with a very thin layer of GaInSb with a 100% Indium concentration causes separation of the valence sub-bands HH1 (0.5399 eV) and LH1 (0.1024 eV) that contain the initial and final hole states for processes involving valence band hole excitation. This separation of 0.4375 eV is significantly larger than the band gap of 0.2665 eV at zone centre. The first heavy hole subband HH1 is highest in energy and the strain and confinement upshift ensures that the first light hole subband LH1 is more than a band gap lower in energy than the first heavy hole subband. The dotted line below level HH1 shows an energy level one bandgap lower than level HH1. There are two electron sub-bands in the conduction band region CB1 at 0.6779 eV and CB2 at 0.9444 eV. Again, the second subband CB2 is more than one band gap in energy above the first. The dotted line above CB1 shows an energy level one bandgap higher than CB1. Thus, certain types of hole and electron excitation processes are rendered much less likely due to a decrease of the available final states for these processes. In particular intervalenceband absorption is virtually eliminated and Auger recombination rates much reduced.

The invention claimed is:

1. A mid-infrared emitting indirect bandgap quantum well semiconductor laser with optical waveguide structure having an active waveguide core comprising at least one repetition of a sub-region comprising in the following order:
    a first wide bandgap barrier layer;
    a first conduction band layer of InAs;
    a thin valence band layer of $Ga_{(1-x)}In_xSb$ where $x \geq 0.7$;
    a second wide bandgap barrier layer which co-operates with the first barrier layer to provide electrical confinement for the carriers within the intervening conduction band and valence band layers.

2. A laser according to claim 1 wherein valence band layer is less than 15 Angstroms thick.

3. A laser according to claim 1 wherein the waveguide structure comprises optical cladding layers of AlAsSb.

4. A laser according to claim 1 wherein the sub-region is repeated between 1 and 5 times.

5. A laser according to claim 1 wherein the barrier layers are made of AlGaAsSb.

6. A laser according to claim 1 wherein the valence band layer comprises $Ga_{(1-x)}In_xSb$ where $x \geq 0.9$.

7. A laser according to claim 1 wherein the valence band layer comprises InSb.

8. A laser according to claim 1 which is grown on a substrate of GaSb or InAs.

9. A laser according to claim 1 wherin the conduction band layers are less than 50 Angstoms thick.

10. The laser according to claim 1 wherin the laser is cascade diode laser.

11. A method of operating a laser according to claim 1 by optical pumping.

12. A method of operating a cascaded diode laser according to claim 10 by electrical pumping.

* * * * *